(12) United States Patent
Gaida et al.

(10) Patent No.: US 12,298,675 B2
(45) Date of Patent: May 13, 2025

(54) PROJECTION EXPOSURE APPARATUS FOR SEMICONDUCTOR LITHOGRAPHY WITH A VIBRATION DAMPER AND METHOD FOR DESIGNING A VIBRATION DAMPER

(71) Applicant: Carl Zeiss SMT GmbH, Oberkochen (DE)

(72) Inventors: Philipp Gaida, Aalen (DE); Michael Erath, Dietenheim (DE); Florian Herold, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 209 days.

(21) Appl. No.: 17/989,813

(22) Filed: Nov. 18, 2022

(65) Prior Publication Data

US 2023/0081234 A1 Mar. 16, 2023

Related U.S. Application Data

(63) Continuation of application No. PCT/EP2021/059809, filed on Apr. 15, 2021.

(30) Foreign Application Priority Data

May 27, 2020 (DE) .......................... 102020206591.8

(51) Int. Cl.
*G03F 7/00* (2006.01)
(52) U.S. Cl.
CPC .......... *G03F 7/709* (2013.01); *G03F 7/70825* (2013.01); *G03F 7/70891* (2013.01)

(58) Field of Classification Search
CPC .. G03F 7/709; G03F 7/70825; G03F 7/70891; G03F 7/7085; F16F 2222/02; F16F 7/108; F16F 15/04; G02B 7/008; G02B 27/646
See application file for complete search history.

(56) References Cited

U.S. PATENT DOCUMENTS

| 8,212,992 | B2* | 7/2012 | Kloesch | .................. G03F 7/709 |
| | | | | 355/53 |
| 8,325,322 | B2* | 12/2012 | Hauf | .................... G02B 7/1815 |
| | | | | 355/30 |
| 9,513,452 | B2* | 12/2016 | Vogler | ..................... G02B 7/02 |

FOREIGN PATENT DOCUMENTS

| DE | 602004000390 T2 | 10/2006 |
| DE | 102009009221 A1 | 8/2010 |
| DE | 102018107444 A1 | 10/2018 |
| DE | 102019205268 A1 | 5/2019 |
| JP | 2004095993 A | 3/2004 |
| WO | WO 2007/006577 A1 | 1/2007 |

OTHER PUBLICATIONS

Translation of International Search Report for corresponding PCT Appl No. PCT/EP2021/059809, dated Jul. 15, 2021.
(Continued)

*Primary Examiner* — Hung V Nguyen
(74) *Attorney, Agent, or Firm* — Fish & Richardson P.C.

(57) ABSTRACT

A projection exposure apparatus has a vibration damper with a holder and a mass that is connected to the holder via a damping element. The vibration damper comprises a temperature control device for the temperature control of the damping element. The disclosure also relates to a method for designing a vibration damper.

22 Claims, 5 Drawing Sheets

(56) References Cited

OTHER PUBLICATIONS

German Office Action, translation thereof, for corresponding DE Appl No. 10 2020 206 591.8, dated Nov. 30, 2020.
Translation of Written Opinion for corresponding PCT Appl No. PCT/EP2021/059809, dated Jul. 15, 2021.

\* cited by examiner

PROJECTION EXPOSURE APPARATUS FOR SEMICONDUCTOR LITHOGRAPHY WITH A VIBRATION DAMPER AND METHOD FOR DESIGNING A VIBRATION DAMPER

CROSS-REFERENCE TO RELATED APPLICATIONS

The present application is a continuation of, and claims benefit under 35 USC 120 to, international application PCT/EP2021/059809, filed Apr. 15, 2021, which claims benefit under 35 USC 119 of German Application No. 10 2020 206 591.8, filed May 27, 2020. The entire disclosure of these applications are incorporated by reference herein.

FIELD

The disclosure relates to a projection exposure apparatus for semiconductor lithography, comprising a vibration damper, and to a method for designing such a vibration damper.

BACKGROUND

Projection exposure apparatuses for semiconductor lithography are subject to extremely stringent desired properties with respect to imaging quality in order to be able to produce the desired microscopically small structures as far as possible without defects. In a lithography process or a microlithography process, an illumination system illuminates a zo photolithographic mask, a photomask, or simply a mask (e.g., a reticle). The light passing through the mask or the light reflected by the mask is projected, via a projection optical unit, onto a substrate (e.g., a wafer), which is coated with a light-sensitive layer (photoresist) and fitted in the image plane of the projection optical unit, in order to transfer the structure elements of the mask to the light-sensitive coating of the substrate. In the process, the mask is moved under the illumination in what is known as a scanning movement, with the substrate being moved in the opposite direction at the same time. The movement of the mask and substrate excite the system, causing the excitation of vibrations, which in turn can negatively affect the imaging quality. Other sources of interference can be, for example, drives for positioning optical elements. During development, the system vibrations are simulated and analyzed and reduced to a minimum through suitable measures such as decoupling components, active control systems, and tuned vibration dampers. Nevertheless, there can be excitations in the projection exposure apparatus during operation, for example excitations from outside or due to an undesirable superposition of vibrations, and these have a negative effect on the imaging quality and therefore have to be damped. Tuned vibration dampers are usually used for individual frequencies. The effect of a tuned vibration damper can depend on the frequency and direction of the vibration and on the mass of the vibration damper. The damping effect of the tuned vibration damper can depend predominantly on the stiffness and the damping of the damping element used in the tuned vibration damper and on the mass. Elastomers are often used as damping elements and their material properties, such as stiffness and damping, can also depend on, inter alia, the temperature. If these are used in areas of the projection optical unit, such as in actuators used there, the temperature of the tuned vibration dampers and hence of the damping elements may vary by several kelvin due to the heating of the actuators during the process. This may change the damping effect of the tuned vibration damper to such an extent that these can no longer sufficiently damp disturbances. This can lead to a deterioration in the imaging properties of the apparatus.

SUMMARY

The present disclosure seeks to provide an improved projection exposure apparatus. The disclosure also seeks to provide a method for designing and selecting a vibration damper for a projection exposure apparatus.

A projection exposure apparatus according to the disclosure for semiconductor lithography comprises a vibration damper with a holder and a mass connected to the holder via a damping element, wherein the vibration damper comprises a temperature control device for temperature control of the damping element. Such a vibration damper can for example be part of a structure or actuator of the projection exposure apparatus for semiconductor lithography and can be mechanically connected via the holder to the structure to be damped. It can thus improve the imaging quality of the projection exposure apparatus by damping parasitic disturbances, for example vibrations, of the structure or actuator. The temperature control device can help make it possible to control the temperature of the temperature-sensitive damping element, which for example comprises an elastomer, that is to say set the temperature of the elastomer to a desired value. As a result, the changes in the temperature-dependent elastomer stiffness and the elastomer damping and, as a result, the damping of the vibration damper for a specific frequency can be reduced to a minimum. Likewise, the natural frequency of the vibration damper can be set to a desired value by choosing a specific temperature and hence the elastomer stiffness. A vibration damper that can be tuned within certain limits can thus be implemented.

For example, the temperature control device can be designed as part of the damping element. The direct temperature control of the damping element that is made possible in this way can lead to the holder and/or the mass only being heated indirectly via the connection between the damping element and the holder or the mass. Furthermore, closed-loop control of the temperature can be made easier as a result and it is possible that only a small amount of heat is introduced as parasitic heat into the structure to be damped. In the process, the temperature control device can be arranged on the surface of the damping element or can be designed as an integral part of the damping element. In the case of an elastomer, for example, the temperature control device can comprise an elastic or stretchable resistance wire which is surrounded by the elastomer and has only little or no effect on the overall stiffness of the elastomeric damping element.

Furthermore, the temperature control device can be arranged on the holder. The holder can be securely connected to the structure to be damped, for example an optical assembly, and therefore does not move relative thereto, like the mass. Firstly, the connection of the temperature control device cannot influence the mechanical properties of the damping element and, secondly, the temperature control device experiences fewer deformations during the vibration to be damped.

In addition, the temperature control device can be arranged on the mass. The temperature-controlled part of the vibration damper can be arranged far from the damped structure, and hence a possibly disruptive heating or cooling of the damped structure can be avoided or at least reduced.

Combined arrangements of the temperature control device on a plurality, or all, of the three aforementioned components of damping element, holder, and mass are also conceivable.

In an embodiment of the disclosure, the temperature control device might not be in mechanical contact with the vibration damper. This can be realized, for example, by an infrared radiation source or by an air flow, which acts for example on the damping element.

For example, the temperature control device can be designed in such a way that the vibration damper, for example the damping element, can be heated. Ideally, the temperature set in this way can be slightly above the maximum temperature that the vibration damper would reach during normal operation of the associated apparatus, such that the vibration damper, for example the damping element, can be kept at a constant temperature purely by supplying heat. In this case, the temperature control device can comprise, for example, resistance heating, infrared heating, a passing fluid, a Peltier element, or a temperature control channel formed in one of the components (holder, damping element, mass) of the vibration damper.

In addition, the temperature control device can be designed so that the vibration damper, for example the damping element, can be cooled. Examples of cooling elements are, for example, Peltier elements or, as already mentioned above, a gaseous fluid flow flowing past the surface of the vibration damper. Alternatively or additionally, the holder, for example, may comprise fluid channels, in which a cooling fluid can be guided. In this case, it may be desirable to choose the set temperature slightly below the minimum temperature that the vibration damper would reach during normal operation of the associated apparatus.

In an embodiment, the vibration damper can comprise a sensor. The latter can be designed, for example, as a temperature sensor or as a vibration sensor and can be arranged on one of the components of the vibration damper. Bimetals, resistance sensors or also contactless infrared sensors can be used as possible temperature sensors. Vibration sensors can be in the form of gyrometers, piezoelectric plates or microelectromechanical systems and, alternatively or additionally, can also be arranged on the structure to be damped. A contactless measurement, for example by a laser, is also conceivable for the vibration measurement. If a temperature sensor is used, the temperature of the vibration damper, for example of the damping element, can be inferred directly from a signal from the temperature sensor, and so this can be used directly for closed-loop control of the temperature of the vibration damper. By contrast, a vibration sensor can be desirable because it can directly detect the vibrations of the structure to be damped that are relevant to the imaging quality, that is to say the influence on the imaging quality is detected directly. In this case, the adjustment of the temperature can be controlled only indirectly by way of a dependence, determined in advance, between the change in the damping and hence the detected vibrations in relation to a temperature change.

Furthermore, the vibration damper can comprise a controller. The latter can be either designed as part of the vibration damper or can be designed as part of a controller for the component to be damped, for example an actuator, or as part of an overall controller for the projection exposure apparatus.

For example, the controller can control the temperature control device using a signal from the sensor as a feedback variable. The target variable, such as the temperature of the vibration damper, for example of the damping element, can be controlled directly. When a vibration sensor is used as a sensor, the dynamic behavior of the vibration damper can be detected and closed-loop control of the temperature can be carried out in a manner derived therefrom. Depending on the design of the actuator and the controller, the control of the actuator can be adjusted on the basis of the detected signal. As a result, the feedback variable, which may have a direct influence on the imaging quality of the projection exposure apparatus, can also be detected automatically and is not dependent on model calculations between the temperature of the vibration damper and the damping of the vibrations that is expected as a result.

As an alternative to this, the controller can control the temperature control device without a feedback variable. This type of control also includes what is known as feedforward control in which the manipulated variables for the temperature control device are determined on the basis of an input variable, such as the power consumption of an actuator contributing to the heating of the vibration damper, and a model that can determine the resultant heating of the vibration damper. This control can be calibrated at specific times, such as when a wafer is changed, by determining the damping of the actuators.

A method according to the disclosure for designing a vibration damper according to any one of the embodiments described above comprises the following method steps:
  determining a target temperature for the vibration damper,
  determining the material properties of the damping element at the target temperature,
  designing the temperature control device,
  designing the vibration damper for the target temperature.

An individual target temperature for each vibration damper can be determined on the basis of the arrangement of the vibration damper in a projection exposure apparatus and the temperature differences to be expected at this position. Firstly, the target temperature can correspond to the ambient temperature of the structure, that is to say the target temperature of the projection exposure apparatus, for example. As a result of the vibration damper heating up due to the structure to be damped or the actuator to be damped heating up and as a result of the energy of the vibration damper itself dissipated into heat during the damping, it can be desirable to cool the vibration damper, in accordance with expectation, in order to reach the ambient temperature. Then again, the target temperature can be determined from a maximum output of the parasitic heat sources and heat sinks in the surroundings of the vibration damper and the amount of heat absorbed by the vibration damper. In addition to the maximum temperature of the vibration damper caused by parasitic heat sources and heat sinks, a safety tolerance may also be taken into account in the process. By way of example, for the case of a damping element comprising an elastomer, the elastomer stiffness and the elastomer damping at the target temperature can be determined on the basis of this target temperature. The temperature control device, which is suitable either for cooling and heating or only for heating or only for cooling, can be designed on the basis of the minimum and maximum parasitic heat sources and heat sinks determined in the first step and the target temperature determined therefrom. Then, the vibration damper can be designed on the basis of this data and, if desired, the damping effect at the target temperature can be verified in a trial.

BRIEF DESCRIPTION OF THE DRAWINGS

Exemplary embodiments and variants of the disclosure are explained in more detail below with reference to the drawing, in which.

EXEMPLARY EMBODIMENTS

Figure 1:
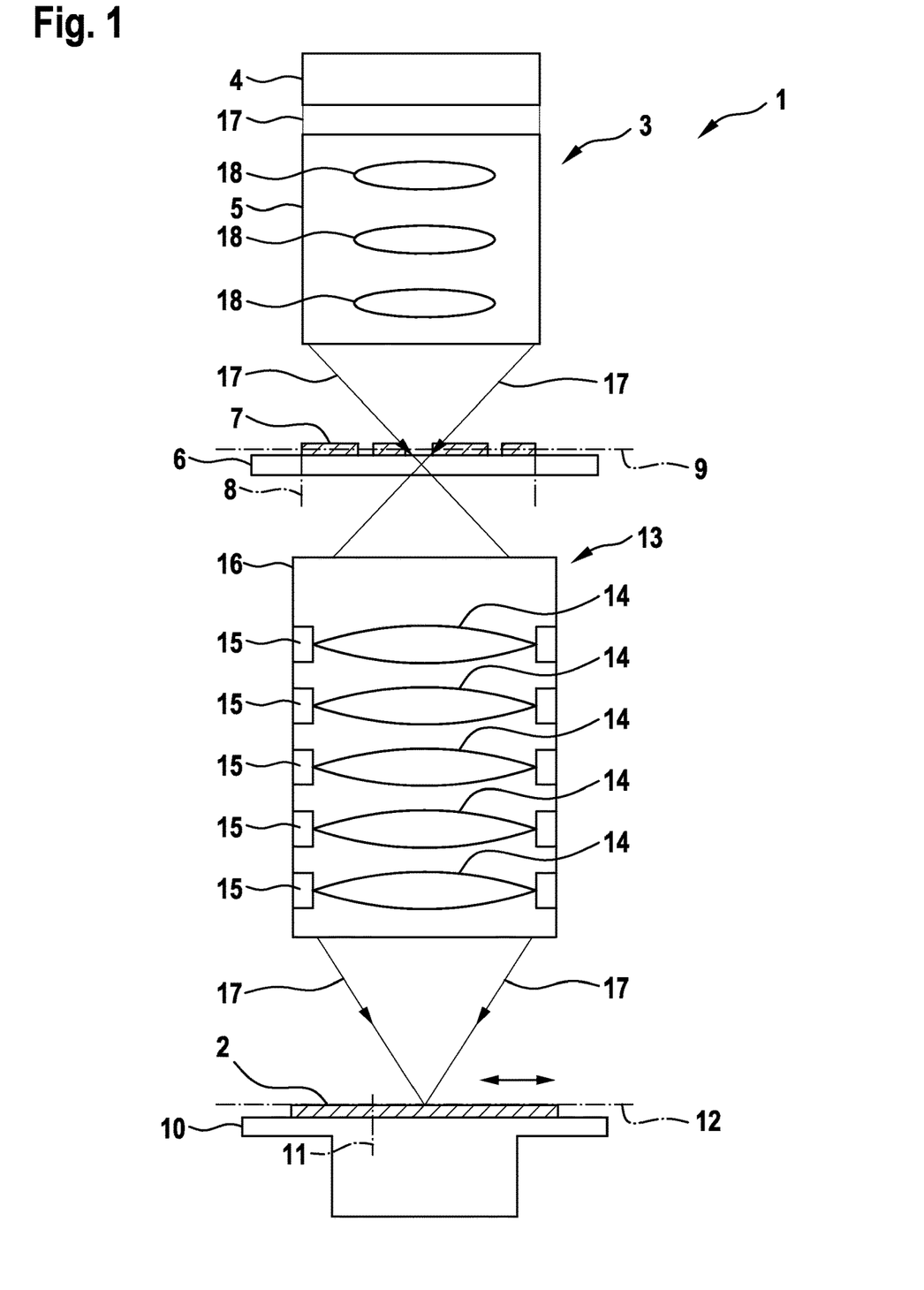
FIG. 1 shows a basic structure of a DUV projection exposure apparatus in which the disclosure can be implemented.

FIG. 1 illustrates an exemplary projection exposure apparatus 1 in which the disclosure can be applied. The projection exposure apparatus 1 serves for the exposure of structures on a substrate which is coated with photosensitive materials, and which generally consists predominantly of silicon and is referred to as a wafer 2, for the production of semiconductor components, such as computer chips.

In this case, the projection exposure apparatus 1 substantially comprises an illumination device 3 for illuminating an object field 8 in an object plane 9, a reticle holder 6 for receiving and exactly positioning a mask provided with a structure and arranged in the object plane 9, the mask being a so-called reticle 7, which is used to determine the subsequent structures on the wafer 2, a wafer holder 10 for mounting, moving and exactly positioning precisely the wafer 2, and an imaging device, namely a projection optical unit 13, having a plurality of optical elements 14, which are held by way of mounts 15 in a lens housing 16 of the projection optical unit 13.

A basic functional principle in this case provides for the structures introduced into the reticle 7 to be imaged on the wafer 2, the imaging generally reducing the scale.

A light source 4 of the illumination device 3 provides a projection beam 17 in the form of electromagnetic radiation, the projection beam being used for the imaging of the reticle 7 arranged in the object plane 9 onto the wafer 2 arranged in the region of an image field 11 in an image plane 12, the electromagnetic radiation being in a wavelength range of between 100 nm and 300 nm, for example. The source 4 used for this radiation may be a laser, a plasma source or the like. The radiation is shaped via optical elements 18 in an illumination optical unit 5 of the illumination device 3 in such a way that the projection beam 17, when incident on the reticle 7 arranged in the object plane 9, illuminates the object field 8 with the desired properties with regard to diameter, polarization, shape of the wavefront and the like.

An image of the reticle 7 is generated by way of the projection beam 17 and, after having been correspondingly reduced by the projection optical unit 13, is transferred to the wafer 2 arranged in the image plane 12, as has already been explained above. In this case, the reticle 7 and the wafer 2 can be moved counter to one another in matched fashion, so that regions of the reticle 7 are imaged onto corresponding regions of the wafer 2 virtually continuously during what is called a scanning operation. The projection optical unit 13 has a multiplicity of individual refractive, diffractive and/or reflective optical elements 14, such as for example lens elements, mirrors, prisms, terminating plates and the like, the optical elements 14 being able to be actuated for example via one or more actuator arrangements, not illustrated separately in the figure.

Figure 2:
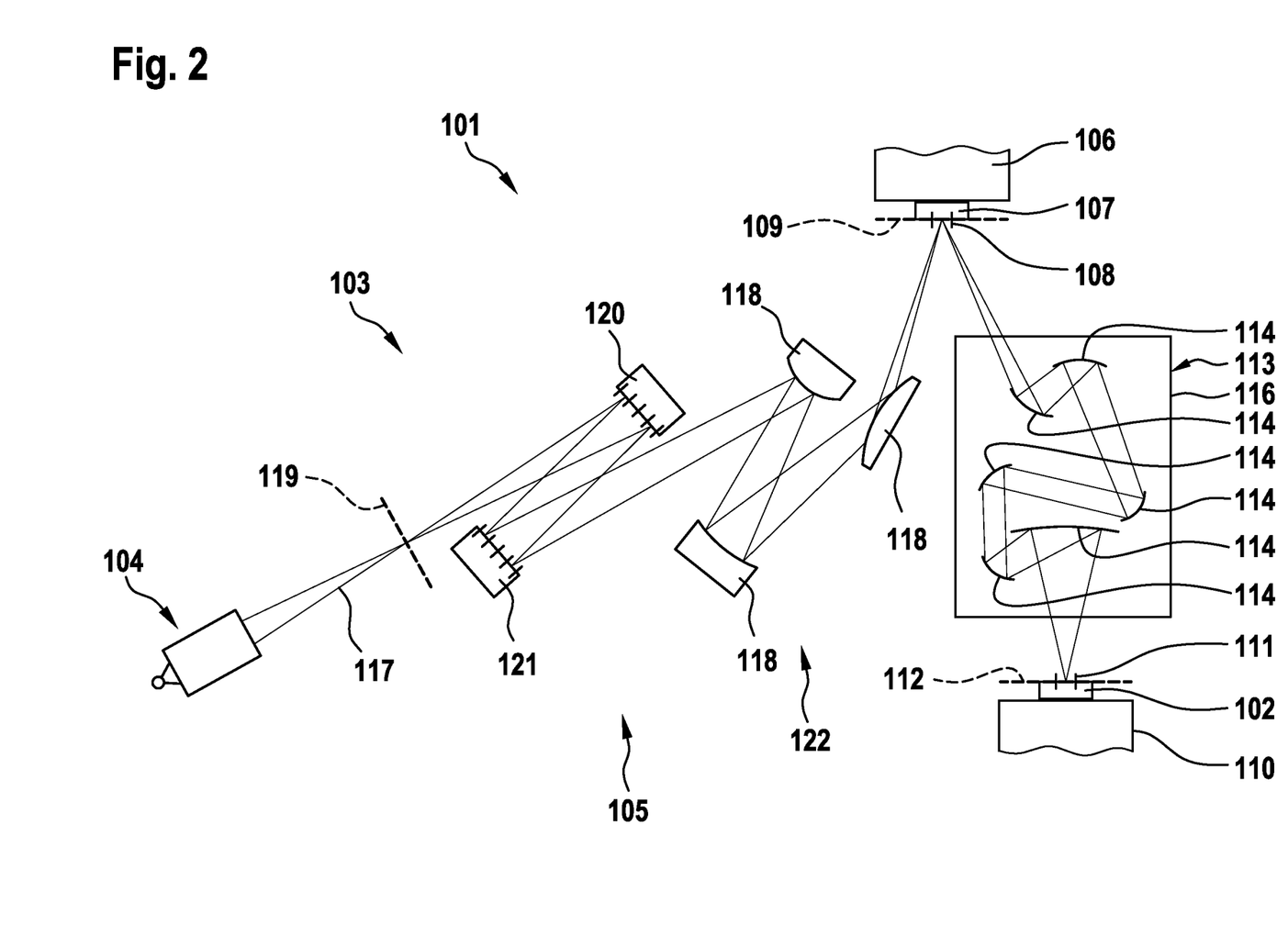
FIG. 2 shows a basic structure of an EUV projection exposure apparatus in which the disclosure can be implemented.

FIG. 2 shows by way of example a basic structure of a microlithographic EUV projection exposure apparatus 101 in which the disclosure can likewise find application. The structure of the projection exposure apparatus 101 and the principle of imaging a structure on a reticle 107 arranged in the object plane 109 onto a wafer 102 arranged in the image field 111 is comparable to the structure and procedure described in FIG. 1. Identical component parts are designated by a reference sign increased by 100 relative to FIG. 1, that is to say the reference signs in FIG. 2 begin with 101. In contrast to a transmitted-light apparatus as described in FIG. 1 shows that only optical elements 114, 118 embodied as mirrors are used for imaging and/or for illumination in the EUV projection exposure apparatus 101 on account of the short wavelength of the used EUV radiation 117 in the range of 1 nm to 120 nm, for example of 13.5 nm.

The illumination device 103 of the projection exposure apparatus 101 comprises, besides a light source 104, an illumination optical unit 105 for the illumination of the object field 108 in an object plane 109. The EUV radiation 117 in the form of optical used radiation generated by the light source 104 is aligned via a collector, which is integrated in the light source 104, in such a way that it passes through an intermediate focus in the region of an intermediate focal plane 119 before it is incident on a field facet mirror 120. Downstream of the field facet mirror 120, the EUV radiation 117 is reflected by a pupil facet mirror 121. With the aid of the pupil facet mirror 121 and an optical assembly 122 having mirrors 118, the field facets of the field facet mirror 120 are imaged into the object field 108. Apart from the use of mirrors 114, the structure of the downstream projection optical unit 113 does not differ in principle from the structure described in FIG. 1 and is therefore not described in further detail.

Figure 3A:
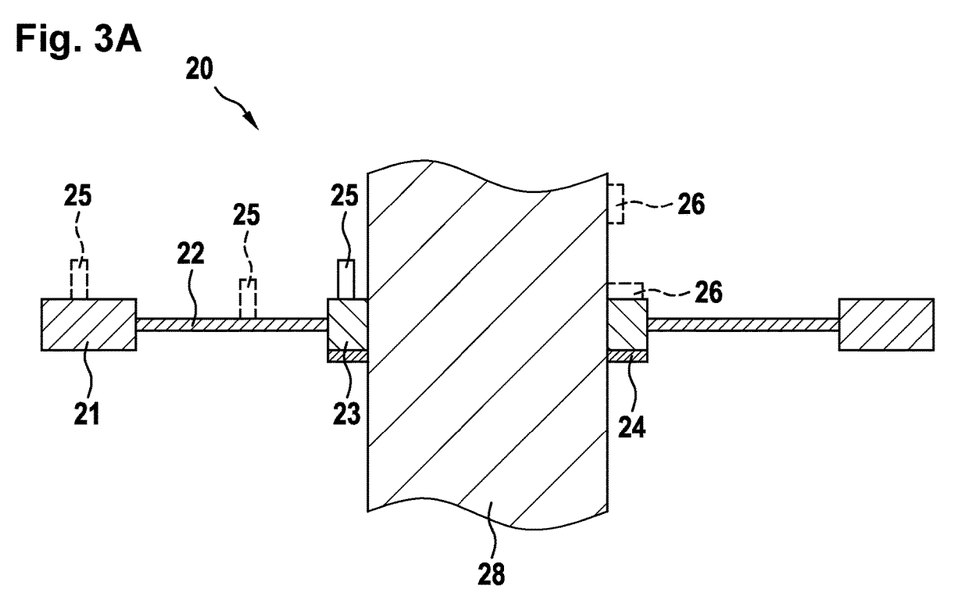
FIGS. 3A-3C show schematic views of in each case an embodiment of the disclosure.

FIG. 3A shows a sectional illustration of a vibration damper 20 according to the disclosure, as can be used in one of the projection exposure apparatuses 1, 101 described in FIGS. 1 and 2. The vibration damper 20 is connected via a holder 23 to a structure to be damped, which is in the form of a pin 28. In this case, the pin 28 can be part of an actuator of one of the projection exposure apparatuses 1, 101 described in FIGS. 1 and 2. In the embodiment shown in the figure, the holder 23 is connected to a mass 21 via a damping element which is designed as a membrane 22 and which comprises an elastomer. Alternatively, the damping element can also have a conical shape or a shape designed as a free-form surface. The vibration damper 20 damps a vibration in the axial direction of the pin 28; the mass 21 designed as a ring thus likewise vibrates in the axial direction of the pin 28, with the membrane 22 being deformed in the process. Kinetic energy of the vibration is dissipated into thermal energy as a result of the material deformation in the membrane 22. The membrane 22 is therefore heated by heat which the actuator gives off during operation and additionally by the heat generated by the dissipation of energy, which leads to a change in the damping behavior of the vibration damper 20 on account of the temperature dependence of the stiffness and damping of the elastomer of the membrane 22. The self-heating of the elastomer through movement is negligible vis-à-vis the external heat source. The holder 23 further comprises a temperature control device in the form of a heating element 24 which is extensively connected to a first side of the holder 23. By controlling the temperature of the vibration damper 20, the latter can be kept at a constant temperature, which as a result leads to a constant stiffness and damping of the elastomer. A temperature sensor 25 which detects the temperature of the holder 23 is arranged on the opposite second side of the holder 23. Alternatively, the temperature sensor 25 can also be arranged on the membrane 22 or the mass 21, which is indicated by dashed lines. However, the arrangement on the holder 23 allows for the secure connection to the pin 28 which can simplify a connection, for example via a cable. The temperature of the membrane 22 can be determined via the detected temperature of the vibration damper 20. From this, it is possible to subsequently determine the amount of energy that has to be introduced into the vibration damper 20 via the heating element 24 in order to keep the temperature of the vibration damper constant at a previously determined target temperature. The temperature sensor 25 can be designed, for example, as a bimetal, as a resistance sensor or else as contactless infrared sensors. Alternatively, a vibration sensor 26 is arranged on the same side of the holder 23 as the temperature sensor 25. In the case where the vibration sensor 26 replaces the temperature sensor 25, the vibration of the holder 23 and hence of the pin 28 is detected, which is why the vibration sensor 26 may also be arranged directly on the pin 28 (shown using dashed lines). The vibration can be compared with a target vibration, whereupon subsequently the damping of the vibration damper 20 is determined on the basis of the determined deviation and the temperature of the vibration damper is determined. The thermal energy provided by the heating element 24 can then be adjusted. A deviation in the vibration of the pin 28 which is relevant to the imaging quality of the projection exposure apparatus 1, 101 is detected directly, whereas the temperature of the vibration damper 20 only allows indirect conclusions to be drawn about the actual vibration of the pin 28. A combination of temperature sensor 25 and vibration sensor 26 combines the features of temperature and vibration closed-loop control. Optionally, the vibration of the pin 28 can also be derived from the control signals of the actuator.

Figure 3B:
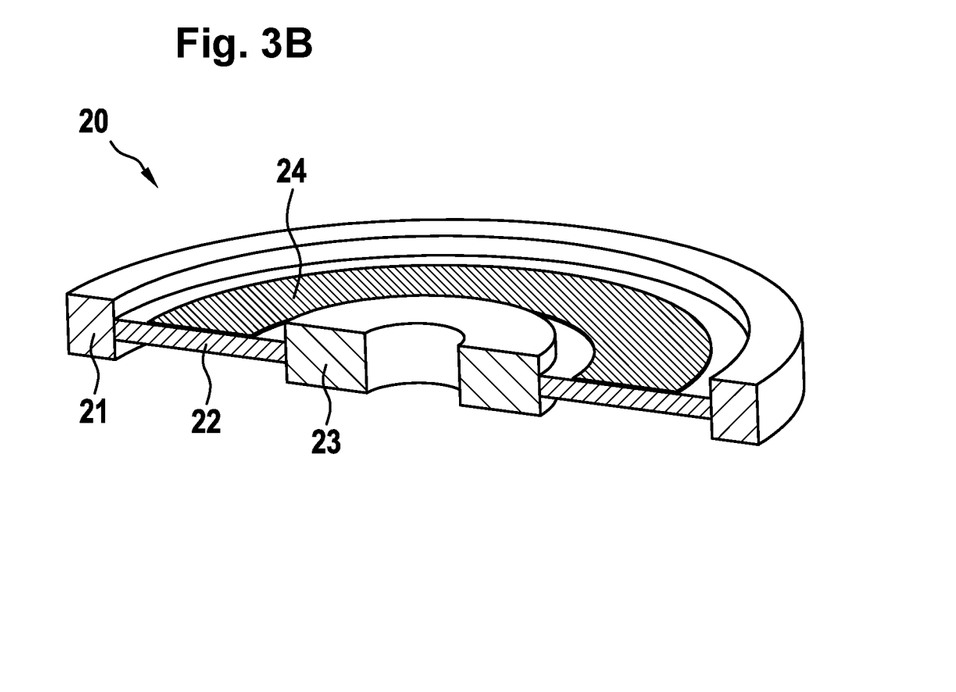
Figure 3C:
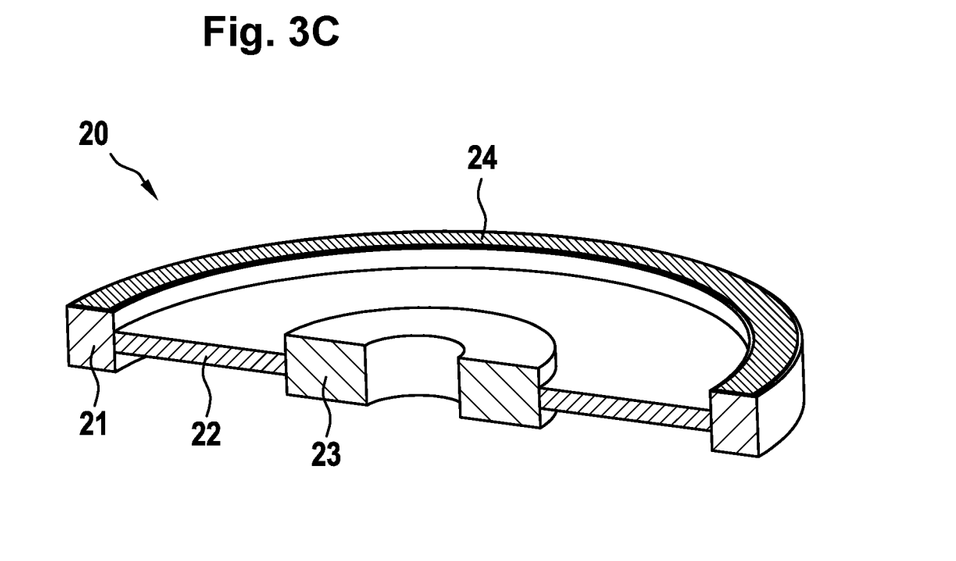

FIGS. 3B and 3C show variants of the embodiment of a vibration damper 20 described in FIG. 3A, which is why only the differences from the embodiment described in FIG. 3A are discussed, and no temperature sensor 25 is shown either.

The heating element 24 is arranged on the membrane 22 in FIG. 3B. The heating element 24 comprises flexible and durable wires, which do not affect the stiffness and damping of the elastomer of the membrane 22 and which are not damaged, for example the wire does not break, as a result of the constant movement of the membrane 22. The heating element 24 can also be surrounded by the elastomer of the membrane 22.

The heating element 24 is arranged on the mass 21 in FIG. 3C. This is desirable, for example, when a majority of the introduced thermal energy flows into the membrane 22 via the holder 23, as a result of which a temperature gradient forms in the membrane 22. By arranging the heating element 24 on the mass 21, the temperature gradient can be minimized.

Figure 4:
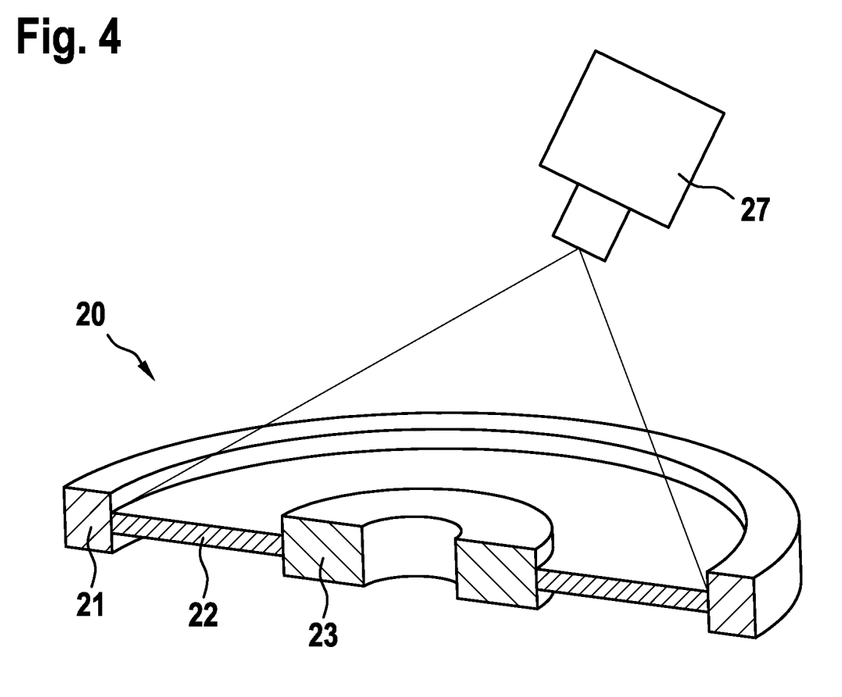
FIG. 4 shows an embodiment of the disclosure.

FIG. 4 shows a vibration damper 20, the temperature control device being designed as an infrared heater 27, that is to say it is not mechanically connected to the vibration damper 20 but acts thereon without contact. The infrared heater 27 is designed in such a way here that the membrane 22 is exposed to infrared radiation over its entire area. Alternatively, the infrared heater 27 can also be designed as a laser, which can apply infrared radiation to the entire surface of the membrane 22 via a scanning movement. This can allow for the membrane 22 to be locally exposed to infrared radiation to different degrees by way of the duration of the irradiation and the intensity of the laser, and so it is possible to set a desired temperature distribution, for example a homogeneous temperature distribution, in the membrane 22. The temperature of the membrane 22 can also be detected contactlessly by an infrared sensor (not shown).

Figure 5:
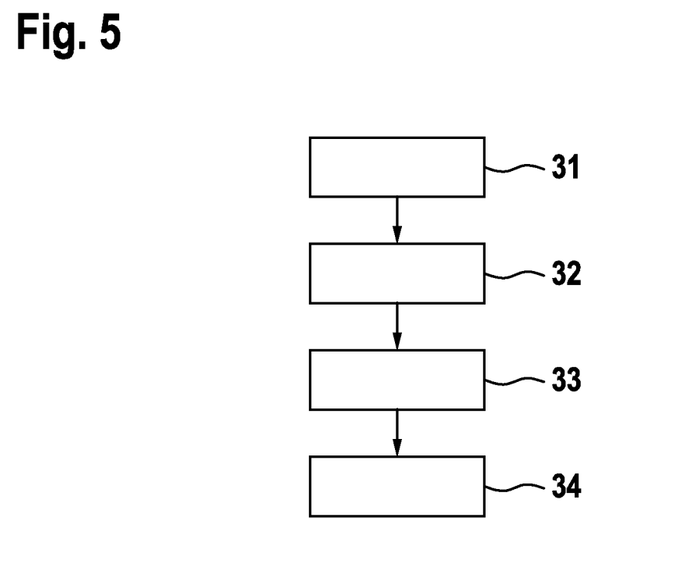
FIG. 5 shows a flowchart for a method according to the disclosure.

FIG. 5 shows a flowchart of a method according to the disclosure for designing a vibration damper described in FIGS. 3A-c and 4, comprising the following method steps:

A target temperature for the vibration damper is determined in a first method step 31. The material properties of the damping element 22 are determined at the target temperature in a second method step 32.

The temperature control device 24, 27 is designed in a third method step 33. The vibration damper 20 is designed in a fourth method step 34.

LIST OF REFERENCE SIGNS

1 DUV projection exposure apparatus
2 Wafer
3 Illumination device
4 Light source
5 Illumination optical unit
6 Reticle holder
7 Reticle
8 Object field
9 Object plane
10 Wafer holder
11 Image field
12 Image plane
13 Projection optical unit
14 Optical elements (projection optical unit)
15 Mounts
16 Lens housing
17 Projection beam
18 Optical elements (illumination device)
20 Vibration damper
21 Mass
22 Membrane
23 Holder
24 Heating element
25 Temperature sensor
26 Vibration sensor
27 Infrared heating
28 Structure
31 Method step 1
32 Method step 2
33 Method step 3
34 Method step 4
101 EUV projection exposure apparatus
102 Wafer
103 Illumination device
104 Light source
105 Illumination optical unit
106 Reticle holder
107 Reticle
108 Object field
109 Object plane
110 Wafer holder
111 Image field
112 Image plane
113 Projection optical unit
114 Optical elements (projection optical unit)
115 Mounts
116 Lens housing
117 Projection beam
118 Optical elements (illumination device)

119 Intermediate focus
120 Field facet mirror
121 Pupil facet mirror
122 Optical assembly

What is claimed is:

1. An apparatus, comprising:
a vibration damper, comprising:
   a holder;
   a mass;
   a damping element connecting the holder and the mass, the damping element having a natural frequency which depends on a temperature of the damping element; and
   a temperature control device; and
a controller configured to:
   i) received a signal from a sensor; and
   ii) based on the signal received from the sensor and a desired natural frequency of the damping element, dynamically control the temperature control device so that the temperature control device either heats or cools the damping element to adjust a temperature of the damping element so that the damping element has the desired natural frequency,
wherein the apparatus is a semiconductor lithography projection exposure apparatus.

2. The apparatus of claim 1, wherein the temperature control device is part of the damping element.

3. The apparatus of claim 1, wherein the temperature control device is supported by the holder.

4. The apparatus of claim 1, wherein the temperature control device is supported by the mass.

5. The apparatus of claim 1, wherein the temperature control device is not in mechanical contact with the vibration damper.

6. The apparatus of claim 1, wherein the temperature control device is configured to heat the vibration damper.

7. The apparatus of claim 1, wherein the temperature control device is configured to heat the damping element.

8. The apparatus of claim 1, wherein the temperature control device is configured to cool the vibration damper.

9. The apparatus of claim 1, wherein the temperature control device is configured to cool the damping element.

10. The apparatus of claim 1, wherein the vibration damper comprises the sensor.

11. The apparatus of claim 1, wherein the vibration damper comprises the controller.

12. The apparatus of claim 1, wherein the signal from the sensor is a feedback variable, and the controller is configured to provide closed-loop control of the temperature control device via the signal from the sensor.

13. The apparatus of claim 1, the vibration damper comprises a controller configured to provide closed-loop control of the temperature control without a feedback variable.

14. The apparatus of claim 1, wherein the temperature control device comprises an infrared heater.

15. The apparatus of claim 1, further comprising a structure held by the vibration damper.

16. The apparatus of claim 15, wherein the vibration damper is configured to dampen vibrations of the structure.

17. The apparatus of claim 16, wherein the structure comprises a pin.

18. The apparatus of claim 15, wherein the structure comprises a pin.

19. The apparatus of claim 1, further comprising an actuator which comprises a structure, wherein the structure is held by the vibration damper.

20. The apparatus of claim 1, wherein:
the vibration damper comprises the sensor;
the sensor comprises a temperature sensor configured to sense a temperature of the vibration damper; and
the signal received by the controller is representative of the temperature of the damping element sensed by the temperature sensor.

21. The apparatus of claim 1, wherein:
the vibration damper comprises the sensor;
the sensor comprises a vibration sensor configured to sense a vibration of the holder; and
the signal received by the controller is representative of the vibration of the holder sensed by the temperature sensor.

22. A method of controlling vibrations of a damping element of a semiconductor lithography apparatus, the damping element being connected to a mass and a holder, the damping element having a natural frequency that depends on a temperature of the damping element, the method comprising:
determining the temperature of the damping element; and
based on a desired natural frequency of the damping element, heating or cooling the damping element to adjust the temperature of the damping element so that the damping element has the desired natural frequency.

* * * * *

UNITED STATES PATENT AND TRADEMARK OFFICE
CERTIFICATE OF CORRECTION

| | | |
|---|---|---|
| PATENT NO. | : 12,298,675 B2 | Page 1 of 1 |
| APPLICATION NO. | : 17/989813 | |
| DATED | : May 13, 2025 | |
| INVENTOR(S) | : Philipp Gaida, Michael Erath and Florian Herold | |

It is certified that error appears in the above-identified patent and that said Letters Patent is hereby corrected as shown below:

In the Specification

Column 1, Line 31, before "photolithographic" delete "zo".

Signed and Sealed this
Twenty-fourth Day of June, 2025

Coke Morgan Stewart
*Acting Director of the United States Patent and Trademark Office*